(12) United States Patent
da Cunha (10) Patent No.: US 7,285,894 B1
(45) Date of Patent: Oct. 23, 2007

(54) SURFACE ACOUSTIC WAVE DEVICES FOR HIGH TEMPERATURE APPLICATIONS

(75) Inventor: Mauricio Pereira da Cunha, Orono, ME (US)

(73) Assignee: University of Maine System Board of Trustees, Bangor, ME (US)

( * ) Notice: Subject to any disclaimer, the term of this patent is extended or adjusted under 35 U.S.C. 154(b) by 113 days.

(21) Appl. No.: 11/046,712

(22) Filed: Jan. 31, 2005

Related U.S. Application Data (60) Provisional application No. 60/544,650, filed on Feb. 13, 2004.

(51) Int. Cl.
*H01L 41/08* (2006.01)

(52) U.S. Cl. .............................. 310/313 A; 310/313 B; 310/313 D (58) Field of Classification Search ............ 310/313 A, 310/313 B, 313 D, 313 R, 363, 364
See application file for complete search history.

(56) References Cited

U.S. PATENT DOCUMENTS

| | | | |
|---|---|---|---|
| 4,249,418 A | 2/1981 | Ebata | |
| 4,399,441 A | 8/1983 | Vaughan et al. | |
| 5,446,452 A | 8/1995 | Litton | |
| 5,686,779 A | 11/1997 | Vig | |
| 5,744,902 A | 4/1998 | Vig | |
| 5,821,673 A | 10/1998 | Pisarevsky et al. | |
| 5,894,251 A | 4/1999 | Taguchi et al. | |
| 5,905,325 A | 5/1999 | Naumenko et al. | |
| 5,912,602 A | 6/1999 | Takagi et al. | |
| 5,917,265 A | 6/1999 | Naumenko et al. | |
| 6,005,325 A | 12/1999 | Inoue et al. | |
| 6,031,315 A | 2/2000 | Abbott | |
| 6,054,794 A | 4/2000 | Naumenko et al. | |
| 6,085,333 A | 7/2000 | Inoue et al. | |
| 6,097,131 A | 8/2000 | Naumenko et al. | |
| 6,186,005 B1 | 2/2001 | Leidl | |
| 6,259,185 B1 * | 7/2001 | Lai ........................ 310/313 B |
| 6,317,014 B1 | 11/2001 | Kadota | |
| 6,323,577 B1 | 11/2001 | Inoue et al. | |
| 6,370,955 B1 * | 4/2002 | Tuller et al. .................. 73/579 |
| 6,429,570 B1 | 8/2002 | Inoue et al. | |
| 6,538,359 B1 | 3/2003 | Hiraku et al. | |
| 6,571,638 B2 | 6/2003 | Hines et al. | |
| 6,758,089 B2 * | 7/2004 | Breed et al. .................. 73/146 |
| 6,955,787 B1 * | 10/2005 | Hanson ....................... 422/50 |
| 6,958,565 B1 * | 10/2005 | Liu ........................ 310/313 R |
| 7,009,325 B2 * | 3/2006 | Kando et al. ........... 310/313 A |
| 7,053,522 B1 * | 5/2006 | da Cunha .............. 310/313 A |
| 7,075,216 B1 * | 7/2006 | Vetelino ..................... 310/338 |
| 2003/0231082 A1 | 12/2003 | Takata et al. | |

OTHER PUBLICATIONS

I.B. Yakovkin et al., Numerical and Experimental Investigation SAW in Lagasite, 1995 IEEE Ultrasonics Symposium, pp. 389-392.

(Continued)

*Primary Examiner*—Mark Budd
(74) *Attorney, Agent, or Firm*—MacMillan, Sobanski and Todd, LLC (57) ABSTRACT

A Surface Acoustic Wave device including a resonator or a delay line formed from an electrically conductive material having a high melting temperature disposed upon the surface of a substrate formed from one of the LGX family of crystals or gallium phosphate. The Surface Acoustic Wave Device is operative as a sensor at high temperatures.

17 Claims, 7 Drawing Sheets

OTHER PUBLICATIONS

V. P. Plessky et al., Surface Transverse Waves on Langasite, 1998 IEEE Ultrasonics Symposium, pp. 139-142.

Y. Satoh et al., SAW Duplexer Metallizations for High Power Durability, 1998 IEEE Ultrasonics Symposium.

H. J. Whitehouse et al., High Temperature Ultrasonic Devices for Harsh Environments (Abstract), 2000 IEEE Ultrasonics Symposium.

Pereira da Cuna et al., Experimental and Predicted SAW Temperature Behavior of Langatate, 2000 IEEE Ultrasonics Symposium, pp. 245-248.

Pereira da Cuna et al., Pure Shear Horizontal SAW on Langatate, 2000 IEEE Ultrasonics Symposium, pp. 231-234.

Pereira da Cuna et al., LGX Pure Shear Horizontal SAW for Liquid Sensor Applications, Proceedings of the 2002 IEEE Sensors, Jun. 2002.

Mitch M.C. Chou et al., Investigation of Crystal Growth and Material Constants of Ordered Langasite Structure Compounds, 2001 IEEE Interantional Frequency Control Symposium, pp. 250-254.

Pereira da Cuna et al., Surface and Pseudo Surface Acoustic Waves in Langatate: Predictions and Measurements, 2002 IEEE Trans. Ultrason. Ferroecec. Freq. Contr., Sep. 2002, pp. 1291-1299.

Pereira da Cuna et al., High Coupling, Zero TCD SH Wave on LGX, 2002 IEEE Ultrasonics Symposium, Oct. 2002.

Pereira da Cuna et al., High Temperature Surface Acoustic Wave Devices: Fabrication and Characterisation, Electronics Letters, May 15, 2003, vol. 39, No. 10, pp. 818-819.

Pereira da Cuna et al., High Temperature LGS Devices with Pt/$Wo_3$ and Pd Sensing films, 2003 IEEE Ultrasonics Symposium, Oct. 2003, pp. 1750-1753.

J. A. Thiele et al., High Temperature SAW Gas Sensor on Langasite, Proceedings of the IEEE Sensors Conference, Oct. 22-24, 2003, pp. 769-772.

J. A. Thiele et al., Dual Configuration High Temperature Hydrogen Sensor on LGS SAW Devices, Proceedings of the IEEE International Ultrasonics 50th Anniversary Joint Conference, Aug. 24-27, 2004.

Jeremy A. Thiele et al., Platinum and Palladium High Temperature Transducers on Langasite, submitted Dec. 16, 2003, accepted Aug. 10, 2004, published in IEEE Transactions on Ultrasonics, Ferroelectrics and Frequency Control, vol. 52, No. 4, Apr. 2005, pp. 545-549.

J. A. Thiele et al., High Temperature LGS SAW Gas Sensor, submitted for publication on Aug. 13, 2004, accepted for publication Mar. 15, 2005, posted on Sensors and Actuators website on May 5, 2005.

* cited by examiner

Cycling exposure to hydrogen with an oxygen baseline. '*' $H_2$ on, 'Δ' $H_2$ off ($f_O$ 84.999 MHz)

FIG. 12

Cycling exposure to hydrogen with a nitrogen baseline. '*' $H_2$ on, 'Δ' $H_2$ off ($f_O$ 167.1455 MHz)

FIG. 13

SURFACE ACOUSTIC WAVE DEVICES FOR HIGH TEMPERATURE APPLICATIONS

CROSS-REFERENCE TO RELATED APPLICATIONS

This application claims the benefit of U.S. Provisional Application No. 60/544,650, filed Feb. 13, 2004, the disclosure of which is incorporated herein by reference.

STATEMENT REGARDING FEDERALLY SPONSORED RESEARCH OR DEVELOPMENT

Partial funding for this project was provided by National Science Foundation Grant Nos. ECS-0134335 and EEC-9820332.

REFERENCE TO A SEQUENCE LISTING, A TABLE, OR A COMPUTER PROGRAM LISTING COMPACT DISC APPENDIX

Not Applicable

BACKGROUND OF THE INVENTION

This invention relates in general to surface acoustic wave devices and in particular to surface acoustic wave devices for use with high temperature gases.

Surface Acoustic Wave (SAW) devices are electronic components that generate guided acoustic waves along a surface of the device. As the acoustic waves propagate along the surface of the device, any changes to the characteristics of the propagation path affect the velocity, and/or the delay, and/or the amplitude of the surface wave. Changes in the wave velocity and or delay can be monitored by measuring changes in the frequency or phase characteristics of the device while changes in amplitude are measured directly from the device. The changes in frequency, phase, and/or amplitude are then correlated to a physical quantity, such as pressure or temperature for measurement, or the detection of the presence of a specific gas. Thus, the device may be used as a sensor. Additionally, SAW devices also may be used as delay lines and resonators in electronic systems, which may be required to operate in harsh environments such as exposure to high temperature gases.

SAW sensors are among the most sensitive and widely used physical and chemical sensors in liquid and gas environments because the propagating acoustic wave has its energy concentrated close to the device surface. Along an arbitrary surface wave propagation direction, a particle in the substrate material describes an elliptical trajectory, with displacement components normal and parallel to the device surface. For liquid sensor applications, any SAW device operational mode with a significant particle displacement component normal to the surface suffers severe attenuation, thus compromising the device performance. However, this is less of a concern for gas sensor applications, since gases generally do not excessively absorb the wave energy. Accordingly, a regular, or generalized, SAW operational mode may be used for gas sensor applications.

SAW devices are typically fabricated on single crystal anisotropic substrates that are also piezoelectric, such as quartz. A piezoelectric material produces electrical charges when the material is subjected to stress. Furthermore, the phenomenon is reversible. A SAW device used as a sensor to measure temperatures, pressures, or the presence of a gas, typically includes a pair of spaced apart intertwined aluminum interdigital electrodes disposed upon the surface of the substrate. Each of the interdigital electrode sets forms a transducer. One of the transducers creates mechanical stress within the substrate by applying an electric field to the crystal. The electric field is oscillatory to create a mechanical wave. Thus, the transducer converts the electrical signals applied to the device into the electromechanical surface acoustic waves that are propagated along the surface of the substrate. The other transducer converts the received mechanical wave back into an electric signal for comparison to the original signal.

As an example of the application of SAW devices, one of the changeable characteristics of the propagation path is the temperature of the surrounding medium, which may be either gas or liquid in nature. The surface waves velocities, which are determined by the orientation, or cut, of the crystalline material used to fabricate the sensor, and the type of crystalline material used to fabricate the sensor, are temperature dependent. Thus, it is possible to correlate the SAW device change in surface wave velocity and material expansion along that orientation to the ambient temperature of the gases or liquids surrounding the device.

High temperature gas sensors are of interest for the aerospace industry as a safety tool for detection of fuel leaks in jet engines, early fire detection and detection of a hostile environment. High temperature gas sensors also are needed to increase combustion efficiency of jet engines, thereby reducing travel costs and air pollution due to unburned jet fuel. While Surface Acoustic Wave (SAW) devices have been successfully used in the past to measure gas temperatures, quartz, a widely used substrate for such devices undergoes an $\alpha$ to $\beta$ transition at about 570° C. and loses its piezoelectric properties. Additionally, aluminum, the most commonly used material to form the interdigital transducers for a SAW device becomes soft when the temperature exceeds a few hundred degrees Centigrade and actually melts at 660° C. Thus, it is apparent that known SAW temperature sensors are limited as to temperature range and cannot be utilized to measure high temperatures, such as temperatures in excess of a few hundred degrees Centigrade. Accordingly, it would be desirable to provide a SAW gas sensor that could be operated at high temperatures that are beyond a few hundred degrees Centigrade.

BRIEF SUMMARY OF THE INVENTION

This invention relates to surface acoustic wave devices that may be used with high temperature gases.

The present invention contemplates a high temperature SAW delay line that includes a substrate formed from a material selected from the LGX family of crystals or gallium phosphate and having a SAW propagation surface. A first interdigital transducer is formed upon the substrate propagation surface from an electrically conductive material having a high melting temperature. The first transducer is operative to launch surface acoustic waves across the propagation surface. The sensor also includes a second interdigital transducer formed upon the substrate propagation surface from an electrically conductive material having a high melting temperature. The second transducer is spaced apart from the first interdigital transducer and is operative to detect the surface acoustic waves launched from the first interdigital transducer. In the preferred embodiment, LGS is used to form the substrate while the interdigital transducers are formed from platinum or palladium. The sensor also includes an adhesive layer that includes zirconium disposed between the substrate and the interdigital transducers. Additionally, the invention contemplates depositing a film of material that is absorptive of a specific gas over the propagation surface and transducers to form a high temperature gas sensor.

The sensor also may be a resonator SAW device that includes two sets of reflecting electrodes formed upon the substrate with each set of reflecting strips, or electrodes, being between each of the interdigital transducers and the end of the substrate adjacent to said interdigital transducer. In the preferred embodiment, the reflecting electrodes are formed from platinum or palladium. The sensor also includes a zirconium adhesion layer disposed between the substrate and the reflecting electrodes. In the preferred embodiment, the ends of the reflecting electrodes are electrically connected by shorting bars; however, the invention also may be practiced without the shorting bars. Furthermore, the device may be fabricated as a one port resonator that includes a single interdigital transducer disposed between the two sets of reflecting electrodes. Additionally, the invention contemplates depositing a film of material that is absorptive of a specific gas over the propagation surface and transducer to form a high temperature gas sensor.

The invention further contemplates a method of fabricating the SAW delay line that includes providing a substrate formed from the LGX family of crystals or gallium phosphate. The substrate is cut to form a SAW propagation surface that is defined by a set of Euler angles. An adhesive layer of Zirconium is disposed upon the propagation surface. Then first and second interdigital transducers formed from an electrically conductive material having a high melting temperature are disposed upon the propagation surface of the substrate over the adhesive layer with the second interdigital transducer spaced apart from the first interdigital transducer. Additionally, a two port resonator may be formed by also disposing two sets of reflecting electrodes upon the adhesive layer with each set of reflecting electrodes being between one of the interdigital transducers and the end of the substrate adjacent to said interdigital transducer. Alternately, a one port resonator may be formed by disposing one interdigital transducer and two sets of reflecting electrodes upon the substrate with each set of reflecting electrodes formed upon the substrate between the interdigital transducer and one of the ends of the substrate.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
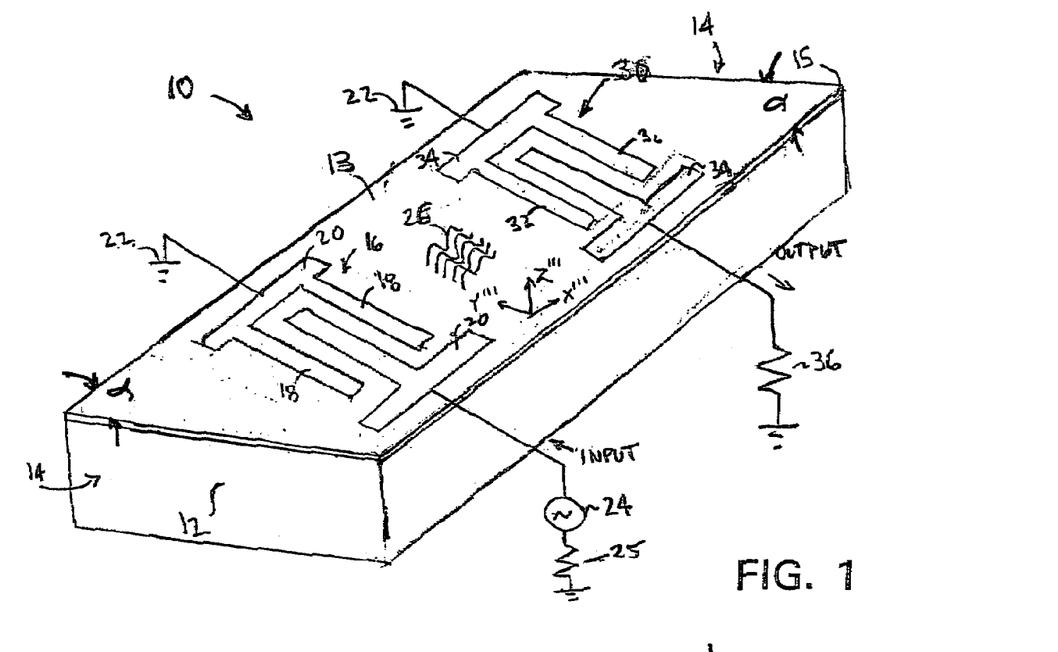
FIG. 1 is a perspective view of a Surface Acoustic Wave delay line device in accordance with the invention that is connected to an unbalanced generator and an unbalanced load.

Referring now to the drawings, there is illustrated in FIG. 1, a SAW device 10 for a high temperature application that is in accordance with the invention. The device 10 includes a substrate 12 formed from a crystal selected from the LGX family of crystals. The substrate 12 includes an upper surface 13 across which SAW propagate. The LGX family of crystals are materials of the trigonal crystal class 32, which is the same crystal class as quartz. The LGX family of crystals includes langatate (LGT, $La_3Ga_{5.5}Ta_{0.5}O_{14}$), langasite (LGS, $La_3Ga_5SiO_{14}$), langanite (LGN, $La_3Ga_{5.5}Nb_{0.5}O_{14}$), and variations, such as LGTS ($La_3Ga_{5.25}Ta_{0.25}Si_{0.5}O_{14}$) and LGZS ($La_3Ga_5Zr_{0.5}Si_{0.5}O_{14}$). In the preferred embodiment, langasite, LGS, is used for the substrate 12. Additionally, the invention also contemplates using gallium phosphate ($GaPO_4$) for the substrate.

Figure 2:
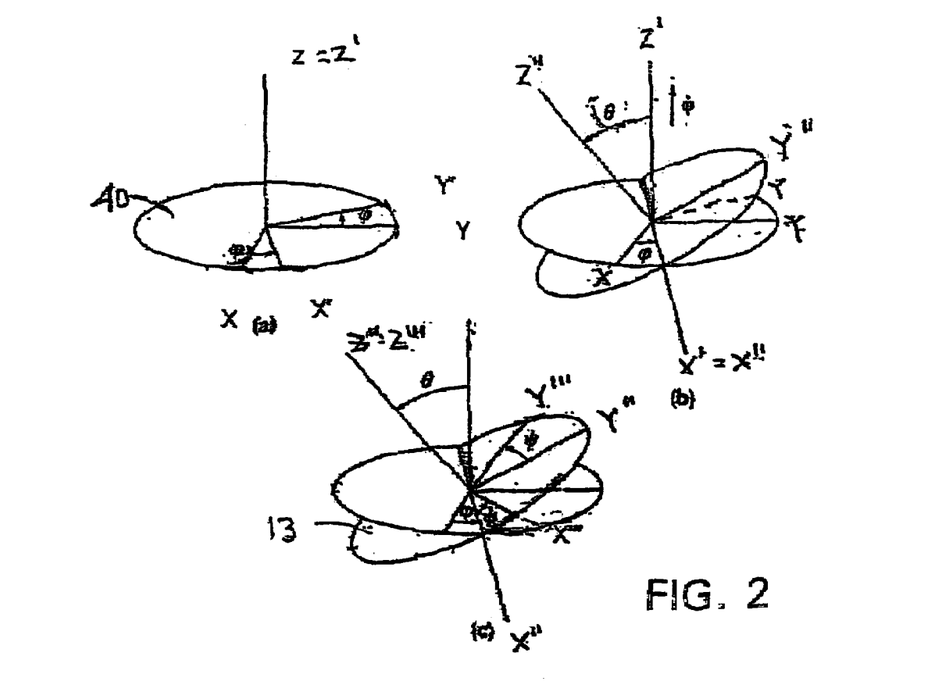
FIG. 2 illustrates the Euler angles that describe the orientation of the rotated substrate crystal axes of the device shown in FIG. 1 and the direction of SAW propagation on the device with respect to the non-rotated crystalline axes.

As described above, the material thermo expansion and the surface wave velocities are temperature dependent and are determined by the orientation, or cut, of the crystalline material used to fabricate the sensor. A set of Euler angles are used to define the cut of the crystalline material used to form the substrate 12. As illustrated in FIG. 2, the uncut LGS material is referenced by three orthogonal axes labeled X, Y and Z, while the surface 13 of the cut LGS material forming the SAW device substrate 12 is referenced by three orthogonal axes labeled X''', Y''' and Z'''. The elliptical surface labeled 40 in FIG. 2 that contains the axes X and Y represents the orientation of the crystals within the uncut LGS material, while the tipped elliptical surface that contains the axes X''' and Y''' represents the orientation of the crystals within the cut LGS material forming the substrate 12. Thus, the tipped surface has the same spatial orientation as the upper surface 13 of the SAW device substrate 12 and is therefore also labeled 13 in FIG. 2.

The spatial relationship between the two surfaces 40 and 13 are defined by first, second and third Euler angles, designated $\phi$, $\theta$ and $\psi$, respectively. The Euler angles represent rotations about the axes of the LGX material 40, to orient the axes, X''', Y''' and Z''', of the cut crystal surface 13. According to convention, the cut surface 13 is considered as being rotated first about the Z axis to offset the X' axis from the X axis by the first Euler angle $\phi$, as illustrated in FIG. 2(a). In FIG. 2(a) the other two axes are designated Y' and Z' following the first rotation. A second rotation then occurs about the X' axis by the second Euler angle $\theta$ to offset the Z'' axis from the Z' axis, as illustrated in FIG. 2(b). In FIG. 2(b), the other two axes are designated X'' and Y'' following the second rotation. Finally, the crystal is rotated about the Z'' axis to offset the X''' axis from the X'' axis by the third Euler angle $\psi$, as shown in FIG. 2(c). In FIG. 2(c), the other two axes are designated Y''' and Z''' following the third rotation. Thus, rotated axis Z''' is perpendicular to the surface 13 of the cut LGX crystals.

Use of the Euler angles ($\phi$, $\theta$, $\psi$) defines a unique substrate orientation. The inventor has determined that a regular SAW mode can be generated upon a crystal selected from the LGX family cut to have a crystal orientation that falls within specific ranges of the Euler angles is appropriate for a SAW device for use in high temperature gas applications. The specific Euler angle ranges include an Euler angle $\phi$ being within a range from $-20°$ to $+20°$; an Euler angle $\theta$, within a range from $0°$ to $+180°$; and an Euler angle $\psi$, within a range from $0°$ to $+90°$. High temperature gas sensors has been successfully fabricated by the inventor having Euler angles of ($0°$, $138.5°$, $26.6°$).

As shown in FIG. 1, each of the ends 14 of the substrate is beveled to form an acute angle, which is labeled $\alpha$, with one of the substrate sides. The beveled ends 14 avoid coherent reflection of SAW's from the substrate ends. However, depending upon the application of the SAW device 10, the beveled ends 14 may be omitted. For low temperature applications, the ends are not beveled, but a strip of wax, silicone rubber, epoxy or photo-resist may be utilized to prevent reflections of the waves.

A thin adhesion layer 15 of zirconium (Zr) is deposited upon the upper surface 13 of the substrate 12. Zirconium is selected over other common alternatives, such as Titanium (Ti), because Zr does not migrate into the electrode material, which would seriously compromise the SAW device performance during operation at high temperatures while also shortening the lifetime of the device. While Zr was used in the preferred embodiment, the invention contemplates that other non-migrating materials also may be utilized for the adhesion layer. In the preferred embodiment, the adhesion layer 15 has a thickness of 40 Å; however, the invention also may be practiced with greater or lesser thickness of the adhesion layer.

As shown in FIG. 1, an input Interdigital Transducer (IDT) 16 is fabricated upon the adhesion layer 15 from an electrically conductive material that has a high melting temperature. The input IDT 16 includes interdigital electrodes having a plurality of intertwined fingers 18. The electrode fingers 18 are perpendicular to axis X''' and parallel to axis Y'''. In the preferred embodiment, the IDT 16 is formed from platinum (Pt) because the material has a high melting temperature of 1769° C. Because platinum has a high density, almost eight times that of aluminum, a platinum film having a thickness of 500 Å is applied. However, it will be appreciated that the invention also may be practiced with greater or lesser thickness of the Pt forming the IDT 16 than 500 Å. Alternately, the preferred embodiment may use palladium (Pd), which has a melting temperature of 1554.9° C., to form the electrodes of the IDT 16. In the preferred embodiment, palladium having a thickness of 3000 Å is applied to the adhesion layer 15. Again, the invention also may be practiced with greater or lesser thickness of the Pd forming the IDT 16 than 3000 Å.

The input IDT 16 is of conventional design and, in the preferred embodiment, has 80 intertwined fingers 18 that are each 4 micrometers wide and a 1:1 mark-to-space ratio. However, the invention also may be practiced with other numbers of fingers and with other finger sizes and spacing for the input IDT 16. For example, the electrode finger width is typically a function of the operating frequency for the device 10. The input transducer 16 also includes a first pair of busbars 20 with each busbar 20 connecting ends of the electrode fingers 18. The busbars 20 provide the capability to electrically connect the input transducer 16 to other electrical components and thus function as terminals for the device 10. While the input IDT 16 is shown with the electrode fingers 18 extending from one of the busbars 20 alternating with the electrode fingers extending from the other busbar, it will be appreciated that the IDT also may include other patterns for the electrode fingers. For example, two or more electrode fingers may extend from one of the busbars between two adjacent electrode fingers extending from the other busbar (not shown).

Figure 3:
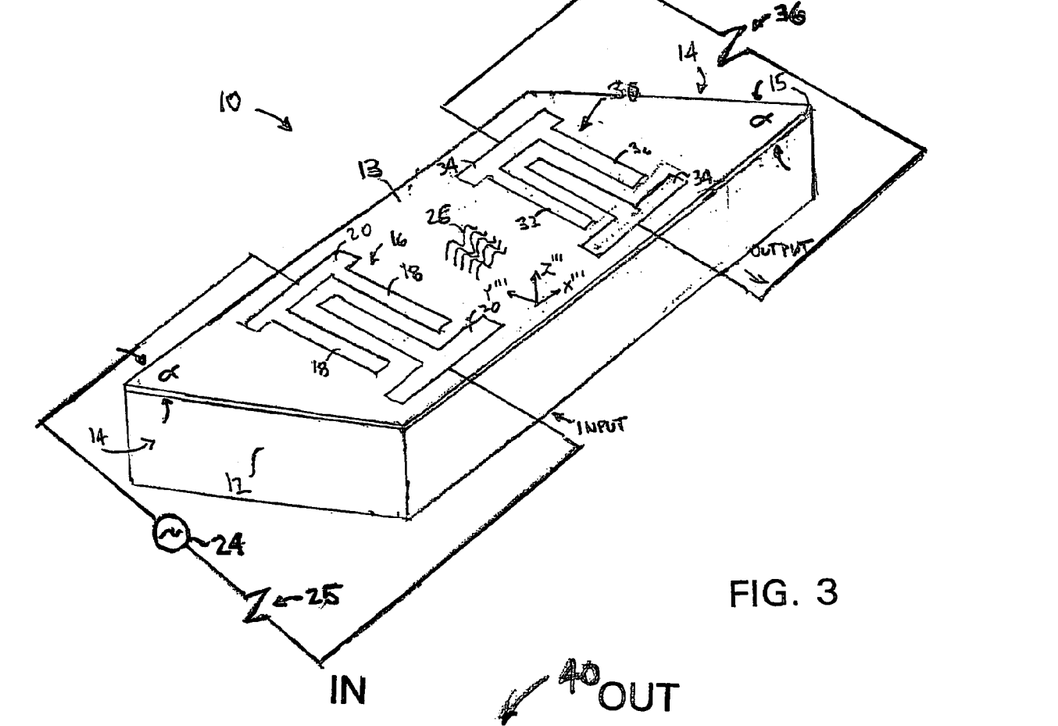
FIG. 3 is a perspective view of the Surface Acoustic Wave delay line device shown in FIG. 1 that is connected to a balanced generator and a balanced load.

As illustrated in FIG. 1, one of the busbars 20 is connected to electrical ground 22 while the other busbar is connected to an electrical component, such as, for example an oscillator 24 and an oscillator internal impedance 25, resulting in an unbalanced connection. Alternately, the oscillator 24 and oscillator internal impedance 25 may be connected across the input IDT busbars 20, as illustrated in FIG. 3, resulting in a balanced, or floating, connection. The input transducer 16 is responsive to excitation by the oscillator 24 to generate surface acoustic waves that propagate across the upper surface 13 of the substrate 12, as shown by the representative regular SAW labeled 26 in FIG. 1. The preferred embodiment of the invention utilizes a regular SAW, which also may be referred to as a generalized SAW, a Rayleigh SAW or an arbitrary symmetry SAW.

In the preferred embodiment, the input IDT 16 is formed by conventional thin film deposition methods and photolithography utilizing ultra-violet light. The method begins by carefully polishing the crystalline substrate surface 13. The method continues with either lift off or wet etch deposition of the input IDT 16 and other metallic structures upon the surface 13 of the substrate 12. In the preferred embodiment, lift off deposition is used; however, wet etch deposition also may be used. With lift off deposition, photo-resist is applied with spin coating over the entire polished substrate surface. The photo-resist is then baked. A mask is placed over the photo-resist and the substrate is exposed to ultraviolet light. If positive photo-resist is used, the mask includes opaque areas that correspond to areas on the substrate surface that are not to be metalized. The areas of photo-resist exposed to the ultraviolet light undergo a chemical reaction that allows them to be subsequently removed by a developing solution. After removing the exposed areas of photo-resist with the developing solution, the adhesion layer 15 is applied over the entire surface. The electrode metal is then deposited by a conventional method, such as vacuum metalization, over the entire adhesion layer 15. Finally, the remaining photo-resist is removed, or lifted off, from the substrate surface 13. As the remaining photo-resist is removed, the adhesion layer and electrode metal covering the photo-resist also is removed, leaving the pattern of metal that defines the input interdigital transducer 16 and other structures. If a negative photo-resist is used, the areas of photo-resist exposed to the ultraviolet light remain while the unexposed areas are removed. Accordingly, the mask used with negative photo-resist is the inverse of the mask described above with the opaque areas corresponding to the areas to be metalized. The unexposed areas of photo-resist are removed with the developing solution and the method continues as described above.

With wet etch deposition, the layer of adhesion layer is applied directly over the entire polished substrate surface and then the electrode metal is deposited over the adhesion layer. The substrate is then spin coated with photo-resist which is cured by baking. Portions of the metal coating that are to be removed are exposed through a mask to ultraviolet light. A mask is placed over the photo-resist and the substrate is exposed to ultraviolet light. If positive photo-resist is used, the mask includes opaque areas that correspond to areas on the substrate surface that are to be metalized. The areas of photo-resist exposed to the ultraviolet light undergo a chemical reaction that allows them to be subsequently removed by a developing solution. After removing the exposed areas of photo-resist with the developing solution, the substrate surface is chemically etched to remove the exposed areas of the electrode metal and adhesion layers. The remaining photo-resist prevents removal of the areas of the electrode metal and adhesion layers that are still covered. Finally, the remaining photo-resist is removed, leaving the pattern of metal that defines the input interdigital transducer 16 and other structures. If a negative photo-resist is used, the areas of photo-resist exposed to the ultraviolet light remain while the unexposed areas are removed. Accordingly, the mask used with negative photo-resist is the inverse of the mask described above with the opaque areas corresponding to the areas that are not to be metalized. The unexposed areas of photo-resist are removed with the developing solution and the method continues as described above.

For the SAW device 10 shown in FIG. 1, the surface acoustic waves propagate along the axis labeled X''' and are received by an output Interdigital Transducer (IDT) 30 that also is formed upon the upper surface 13 of the substrate 12 from an electrically conductive material that has a high melting temperature. In the preferred embodiment, the output IDT 30 is formed from platinum by the same conventional thin film technology described above. Alternately, the preferred embodiment of the output IDT 30 may be formed from palladium. Similar to the input IDT 16, the output IDT 30 includes 80 interdigital electrodes having a plurality of intertwined fingers 32 that are each 4 micrometers wide and a 1:1 mark-to-space ratio. However, the invention also may be practiced with other numbers of fingers and with other finger sizes and spacing for the output IDT. For example, the electrode finger width is typically a function of the operating frequency for the device 10. The electrode fingers 32 are perpendicular to axis X''' and parallel to axis Y'''. The output transducer 30 also includes a second pair of busbars 34 with each busbar 34 connecting ends of the electrode fingers 32. The busbars 34 provide the capability to electrically connect the output transducer 30 to other electrical components. While the output IDT 30 is shown with the electrode fingers 32 extending from one of the busbars 34 alternating with the electrode fingers extending from the other busbar, it will be appreciated that the IDT also may include other patterns for the electrode fingers. For example, two or more of electrode fingers may extend from one of the busbars between two adjacent electrode fingers extending from the other busbar (not shown).

As described above for the input IDT 16, one of the output IDT busbars 34 may be connected to electrical ground 22 while the other busbar is connected to an electrical component, such as, for example a load 36, as illustrated in FIG. 1, resulting in an unbalanced connection. Alternately, the load 36 can be connected across the output IDT 30 busbars 34, as illustrated in FIG. 3, resulting in a balanced, or floating, connection. The output IDT 30 is operative to convert the electromechanical SAW's back into an electrical signal. For the SAW device 10 shown in FIG. 1, the signal generated by the output IDT 18 is applied to the electrical load labeled 36.

As shown in FIG. 1, the device 10 is configured as a delay line with the output IDT 30 spaced apart from the input IDT 16. In the preferred embodiment, the input and output transducers 16 and 30 have an aperture distance, or the length of the overlapping portions of the electrode fingers, that is equivalent to 50 SAW wavelengths; however, other aperture distances may be used. Also, the centers of the IDTs 16 and 30 are separated along the direction of propagation by a distance that is equivalent to 350 SAW wavelengths; however, the invention also may be practiced having other distances separating output IDT 30 from the input IDT 18. The distance may be expressed in either wavelengths of in measured units of length. Thus, for example, the invention also contemplates that the centers of the IDTs 16 and 30 may be separated by a distance within a range of five to 3,000 wavelenths or a range of one mm to five cm.

Several significant improvements have been obtained with the present invention. The inventor has discovered that the SAW device 10 as shown in FIG. 1 and having platinum or palladium electrode fingers deposited upon a LGS substrate is capable of operating in high temperature environments, up to temperatures of about 750° C. The inventor also expects that the device 10 can be successfully operated at temperature well in excess of 750° C. A similar SAW sensor having platinum IDTs disposed directly upon a conventional quartz substrate (not shown) was also fabricated and tested in the same high temperature environment. The inventor found that an output signal no longer could be detected from the quartz sensor when it was exposed to temperatures in the 570-580° C. range. Additionally, irreversible loss of the piezoelectric effect was experienced for the quartz at 625° C. An auger analysis and X-ray photoelectron spectroscopy of the quartz substrate revealed the migration of silicon from the quartz substrate into the platinum IDT film, after the device had been exposed to high temperatures for several hours. In contrast, the device 10 was successfully operated for over six months in a high temperature gaseous environment, an unexpected duration of operation.

Figure 4:
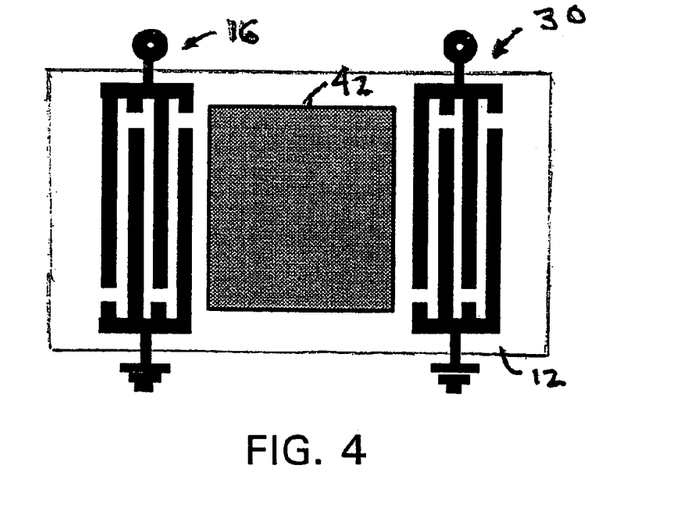
FIG. 4 is a plan view of an alternate embodiment of the Surface Acoustic Wave delay line shown in FIG. 1 that is intended for gas detection.

The delay line configuration shown in FIG. 1 may be used in high temperature and pressure sensors applications and within electronic equipment intended for use in a high temperature environment. The invention also contemplates modifying the delay line shown in FIG. 1 to function as a sensor. Such a sensor 40 is illustrated in FIG. 4 where components that are similar to components shown in FIG. 1 have the same numerical designators. As shown in FIG. 4, a thin film of material 42 that is absorptive of a specific gas is deposited upon the substrate surface 13 between the IDT's 16 and 30. When exposed to the gas, the sensing film 42 absorbs some of the specific gas and changes the propagation characteristics of the SAW's, such as the velocity of wave propagation. The change in wave propagation velocity is detected and indicative of the presence of the gas. Because of the materials, the device 40 may be used as a gas detector in high temperature environments, such as jet engine exhaust ports. As shown in FIG. 4, the ends of the substrate 12 are not beveled to form an acute angle with the sides of the substrate, as described above; however, the invention also may be practiced with substrate ends formed at an angle α to the sides, as shown in FIG. 1.

The invention also contemplates that, for several applications, the platinum or palladium films forming the IDTs are sufficient for sensing the presence of a gas. Certain gases, such as, for example, $H_2$ are absorbed directly into the Pd IDT film and cause a change in the velocity of SAW propagation without the additional film 42 shown in FIG. 4. Also, as will be described in the following, the sensing film may be deposited over the entire upper surface of the substrate to include the IDTs 16 and 30.

Figure 5:
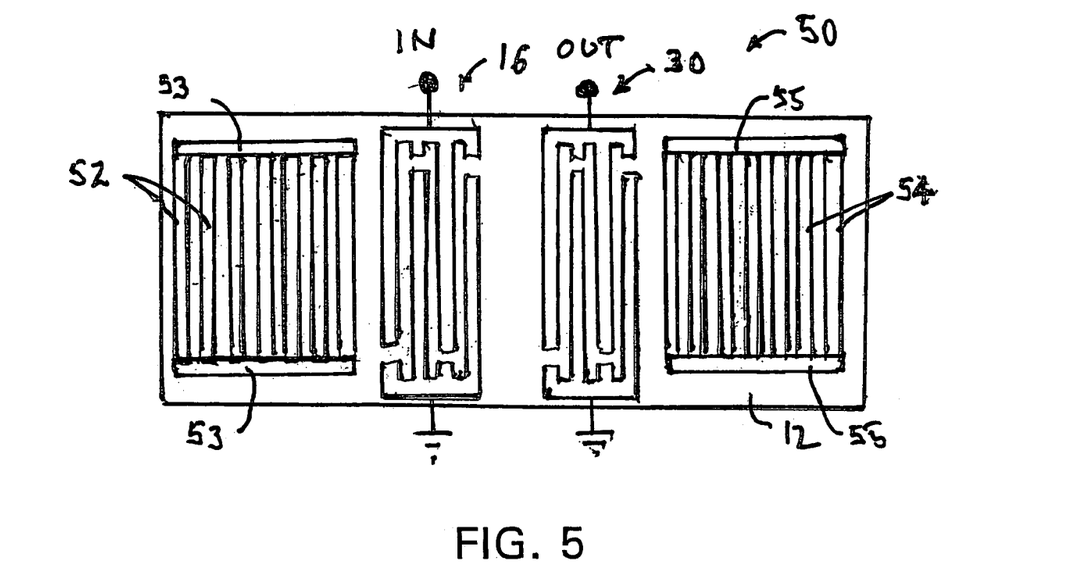
FIG. 5 is a plan view of a two port Surface Acoustic Wave resonator in accordance with the invention that includes shorted reflecting strips and is intended for gas detection.

The present invention also contemplates another embodiment shown generally at 50 in FIG. 5 where the device is configured as a two port resonator. Components shown in FIG. 5 that are similar to components shown in the previous figures again have the same numerical designators. The SAW device 50 includes a plurality of parallel reflector strips, or reflecting electrodes, 52 and 54 that extend transversely across the ends of the LGX substrate 12. The reflecting strips 52 and 54 are formed from the same electrically conductive material having a high melting temperature as the IDT's 16 and 30. In the preferred embodiment, there 250 strips having a 500 Å thickness are formed upon each end of the substrate 12. However, it will be appreciated that the invention also may be practiced with greater or lesser thickness of the material forming the reflecting electrodes 52 and 54 than 500 Å. Also in the preferred embodiment, the reflector strips are each 4 micrometers wide and the reflector strips have a 1:1 mark-to-space ratio. Again, it will be appreciated that the invention also may be practiced with other numbers of, or sizes and spacing, for the reflecting electrodes 52 and 54. Additionally, the width of the individual reflecting electrodes used in the resonator may vary. The two port resonator 50 also includes a first pair of shorting bars 53 that electrically connect the ends of the reflecting strips 52 to the left of the drawing and a second pair of shorting bars 55 that electrically connect the ends of the reflecting strips 54 to the right of the drawing. The shorting bars 53 and 55 restrict the operation of the reflecting strips 52 and 54, respectively, by eliminating any electrically caused portion of the reflected SAW while modifying the response of the resonator 50. Thus, any reflections present in the resonator 50 are limited to mechanical, or mass loading, components of the SAW. As shown in FIG. 5, the ends of the substrate are not beveled, as described above; however, it may be useful to have the substrate ends formed at an acute angle α to the sides, as shown in FIG. 1, to avoid reflection of other modes at the border that could interfere with the main reflected mode. In the preferred embodiment, the reflector strips are formed from platinum or palladium by the same conventional thin film technology described above.

One of the busbars for each of the IDT's is typically electrically grounded while the other busbar is either the input terminal or output terminal for the device resulting in an unbalanced loading of the device 50. Alternately, a balanced connection (not shown), as described above, may be used with the device 50. The input IDT 16 generates a SAW that is reflected by the reflector strips 52 and 54 to generate a standing wave upon the propagation surface of the device 50. Thus, the device 50 functions as a resonator cavity at a resonance frequency determined by the configuration of the device. The output IDT 30 is used to sample the standing wave. The resonator device 50 is intended for use in high temperature environments as a filter or other frequency control device. By monitoring the shift in the frequency or phase response of the resonator device 50, the device also may be used to measure temperatures, pressures, and/or gas presence and concentration.

Figure 6:
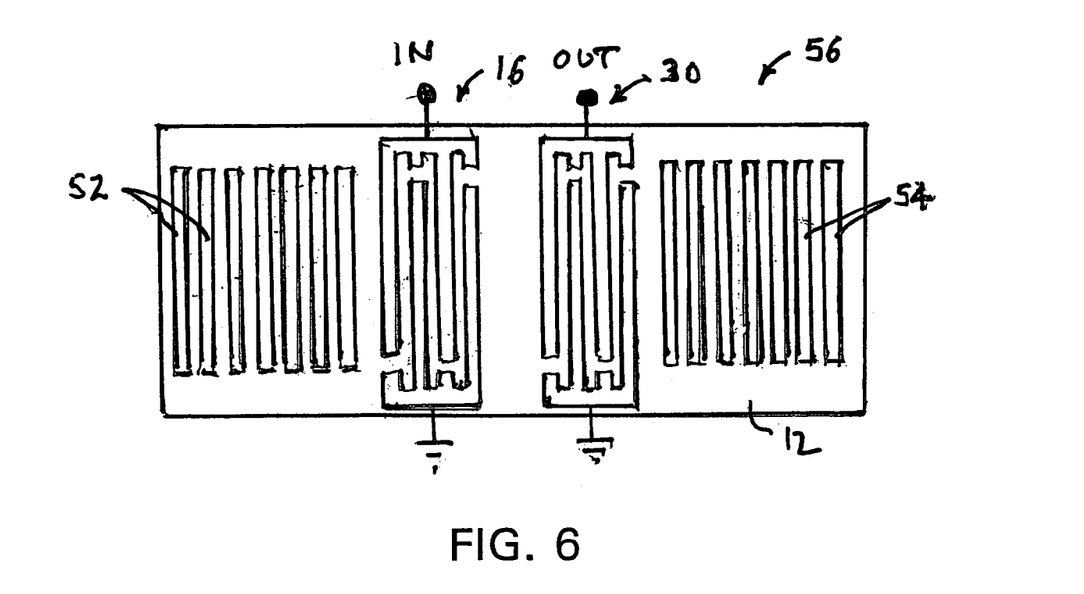
FIG. 6 is a plan view of an alternate embodiment of the resonator shown in FIG. 5 that includes open reflecting strips.

The invention also contemplates an alternate embodiment of the two port resonator 50 that is shown generally at 56 in FIG. 6, where components that are similar to components shown in the preceding drawings have the same numerical identifiers. The resonator 56 is similar to the resonator 50 described above, except that the shorting bars 53 and 55 have been omitted.

Figure 7:
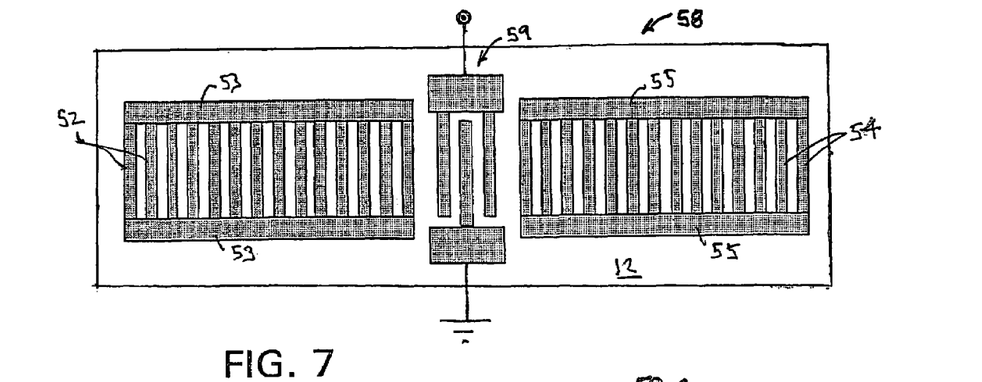
FIG. 7 is a plan view of an alternate embodiment of the resonator shown in FIG. 5 that has a single IDT.
Figure 7A:
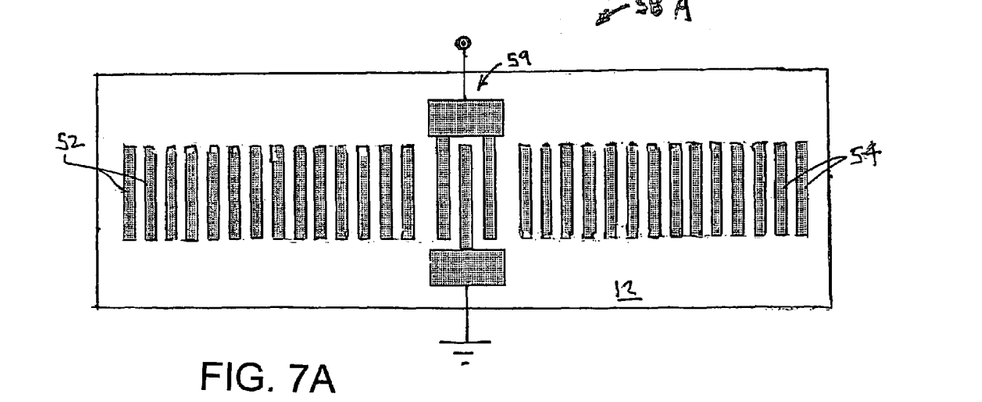
FIG. 7A is a plan view of an alternate embodiment of the resonator shown in FIG. 7.

Yet another embodiment of the resonator is shown generally at 58 in FIG. 7, where components that are similar to components shown in the preceding drawings again have the same numerical identifiers. The resonator 58 is a one port device having a single IDT 59 disposed between two sets of reflector strips 52 and 54. As shown in FIG. 7, the ends of each set of reflector strips 52 and 54 are electrically connected by pairs of shorting bars 53 and 55, respectively. Alternately, the shorting bars 53 and 55 may be omitted as shown for the one port resonator 58A illustrated in FIG. 7A. The single IDT 59 generates a SAW that is reflected by the reflector strips 52 and 54 to create a standing wave or a resonator cavity at the resonate frequency. While the resonance is the same as occurs in the two port resonators 50 and 56 described above, the single IDT 59 also is utilized to sample the resonating signal. Such one port resonators 58 may not only be used for sensor and frequency control functions, but also for filtering applications where several one port resonators may be utilized as a bandpass filter (not shown). While the preferred embodiment of a one port resonator is shown in FIG. 7, it will be appreciated that the invention also contemplates a one port resonator that does not include the shorting bars 53 and 55 (not shown).

As described above, the two port resonator SAW device 50 also can be used as a high temperature gas detection device. Such a gas detection device is illustrated generally at 60 in FIG. 8 where components that are similar to components shown in the preceding figures have the same numerical identifiers. The high temperature gas detector 60 includes a layer 62 of chemically sensitive material applied to the upper surface 13 of the substrate 12 and over the IDT's 16 and 30, the reflector strips 52 and 54 and the shorting bars 53 and 55. During operation of the gas sensor 60, the chemically sensitive layer 62 absorbs specific vapors from the surrounding air. The absorption changes the mass loading and the film parameters of the sensor 60 and thus has an effect upon the device's frequency response. The change in frequency response is correlated with the specific gas being detected. Because the sensor 60 is fabricated with heat tolerant materials, the sensor can be utilized to detect specific gases in a high temperature environment. Alternately, a biological film (not shown) can be deposited on the upper surface 13 of the substrate 12 and over the IDT's 16 and 30, the reflector strips 52 and 54 and the shorting bars 53 and 55 to enhance detection of biological agents present in the surrounding environment.

As described above, for certain gases, the platinum or palladium films forming the IDTs and reflector strips are sufficient for sensing the presence of a gas. In such cases, the chemically sensitive layer 62 may be omitted from the sensor (not shown). Additionally, the high temperature gas sensor 60 also may be configured as a one port resonator device (not shown), similar to the device shown in FIG. 7, but with chemically sensitive material applied to the upper surface 13 of the substrate 12 and over the single IDT 59, the reflector strips 52 and 54 and the shorting bars 53 and 55.

While the preferred embodiment of the sensor 60 has been illustrated with pairs of shorting bars 53 and 55 connecting the ends of the reflector strips 52 and 54, respectively, it will be appreciated that invention also may practiced with the shorting bars 53 and 55 omitted (not shown).

Figure 9:
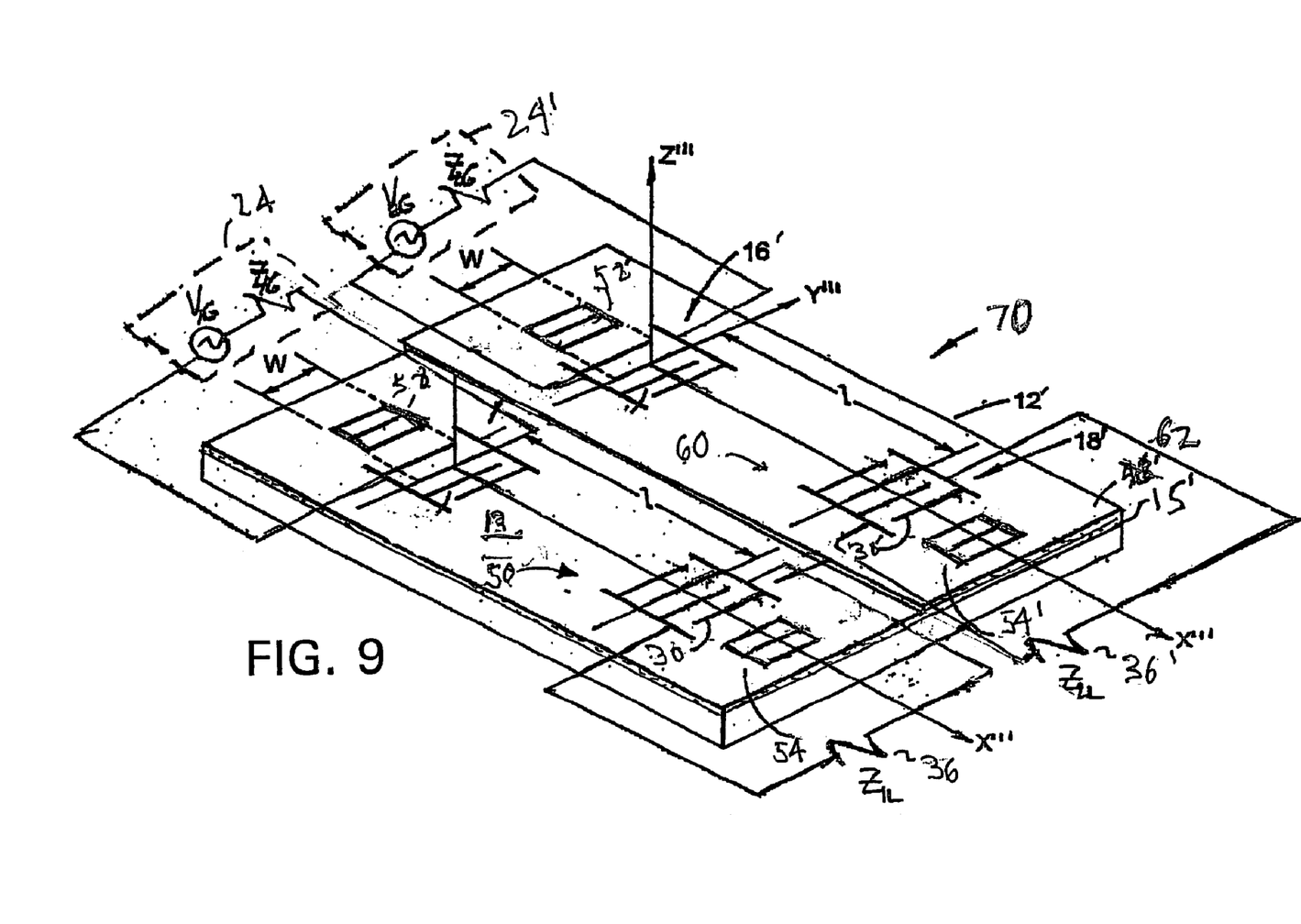
FIG. 9 is a perspective view of a combined Surface Acoustic Wave device that includes dual two port Surface Acoustic Wave resonators as shown in FIG. 8.

The invention also contemplates a combined sensor, shown generally at 70, in FIG. 9 that provides both temperature data and gas detection in a high temperature environment. Components shown in FIG. 9 that are similar to components shown in preceding figures have the same numerical identifiers. As shown in FIG. 9, a single substrate 14 carries a first Surface Acoustic Wave resonator 50 for measuring temperature and a second Surface Acoustic Wave resonator 60 with a surface coating 62 for detecting the presence of a specific chemical substance, such as, for example, a gas. The components of the second resonator 60 are identified with primes. Thus the sensor 70 provides dual functions. Additionally, the temperature data obtained from the temperature sensor 50 in FIG. 96 can be utilized for temperature compensation of the chemical detection data obtained from the upper sensor 60. While the preferred embodiment of the sensor 70 has been illustrated with pairs of shorting bars connecting the ends of the reflector strips, it will be appreciated that invention also may practiced with the shorting bars omitted (not shown). Additionally, the high temperature gas sensor 70 also may be configured utilizing a one port resonator device (not shown), similar to the device shown in FIG. 7. Similarly, the present invention contemplates utilizing a pair of delay lines deposited upon a single substrate (not shown). With dual delay lines, one delay line would be used to measure temperature while the other delay line, with a surface coating for detecting a chemical substance deposited between the IDT's, would be used to detect the presence of the chemical substance.

EXPERIMENTAL RESULTS

Figure 10:
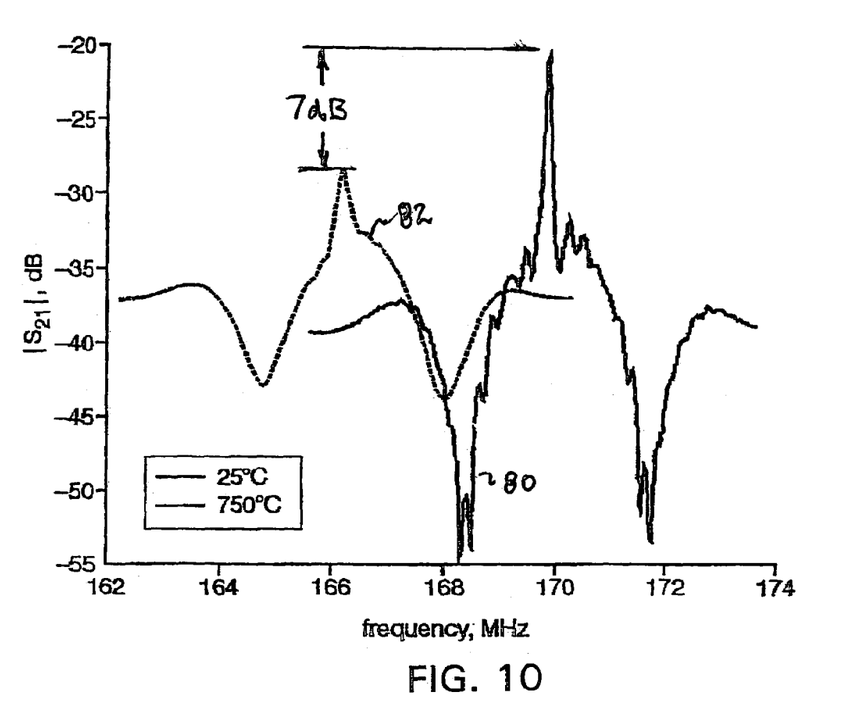
FIG. 10 is an experimentally obtained graph illustrating the frequency variation of the scattering parameter transmission coefficient amplitude, $|S_{21}|$, for a SAW device in accordance with the invention for two temperatures.

The frequency response of a two port SAW resonator fabricated with Pt transducers on Zr with an LGS substrate in accordance with the invention is illustrated by the frequency response curve shown in FIG. 10 where the transmission coefficient, $|S_{21}|$, which is the ratio of the transmitted power to the applied power, is plotted a function of oscillator frequency. The response of the sensor 10 at a room temperature of 25° C. is shown by the solid line that is labeled 80, while the response at 750° C. is shown by the dashed line that is labeled 82. As illustrated in FIG. 10, a seven db loss is noted between the peak of the 750° C. response curve 82 and the peak of the 25° C. response curve 80, with a frequency shift of about 3.5 MHz. Additionally, the inventor observed that additional losses at the higher temperature decreased the Q for the sensor from 2123 to 554, thus demonstrating a temperature sensitivity in the response for the device. Similar tests upon a SAW resonator fabricated with Pd transducers operated at a temperature of 250° C. produced only a two db decrease in $|S_{21}|$ over a six week period. Furthermore, the transducer electrodes for both devices showed no metal surface degradation, as verified from an equivalent four probe resistivity measurement and recorded XPS data. The inventor believes that the LGS SAW IDT's fabricated and tested qualify the transducers and devices for harsh environment, high temperature and pressure, modern applications such as combustion engines, high power communications, and gas and oil well applications.

Figure 11:
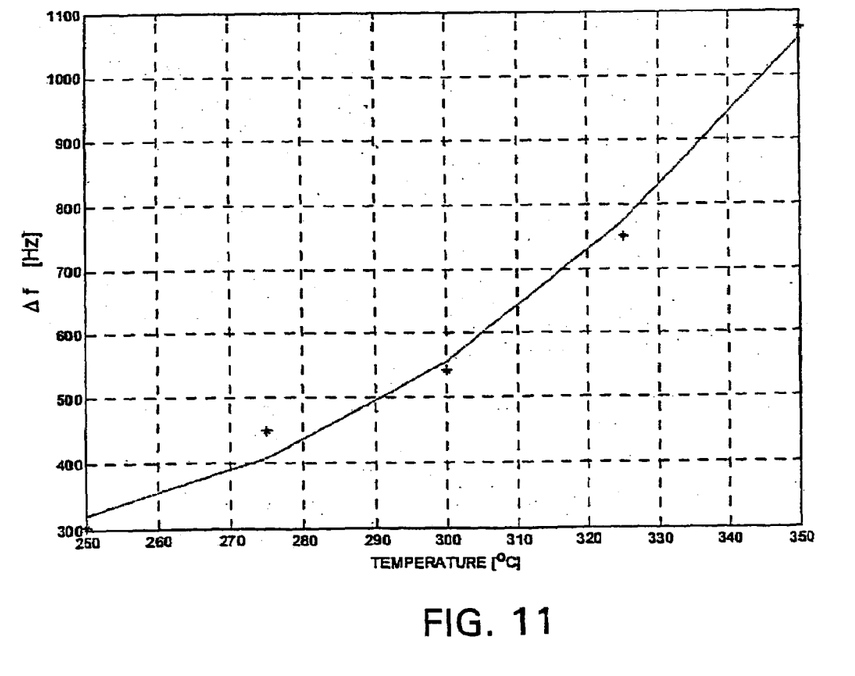
FIG. 11 is an experimentally obtained graph of $\Delta f$ vs $^\circ$ C. indicating the removal of oxygen from platinum and the formation of $CO_2$ and $H_2O$.

The inventor also performed gas sensor experiments with a SAW resonator in accordance with the invention having platinum IDT's and reflecting strips deposited upon an adhesive layer of zirconium. The resonator was exposed to $O_2$ for thirty minutes to oxidize the platinum film, followed by exposure to $C_2N_4/N_2$ for 15 minutes. In the temperature range from 250° C. to 350° C., the dominant physical phenomenon observed by the inventor was the removal of surface-bound oxygen from the platinum film of the resonator by the reaction with $C_2H_4$ to form $CO_2$ and $H_2O$. A positive frequency variation, $\Delta f$, from 0.3 KHz at 250° C. to 1.1 KHz at 350° C. was observed and is illustrated by the graph shown in FIG. 11. The positive frequency variations in FIG. 11 consistently indicate removal of mass from the platinum film on the surface of the high temperature LGS SAW sensor. Accordingly, the inventor believes that the sensor 10 may be used to detect the presence of hydrocarbons, CO, $CO_2$, $NO_X$ and $H_2$ in combustion gases.

Figure 8:
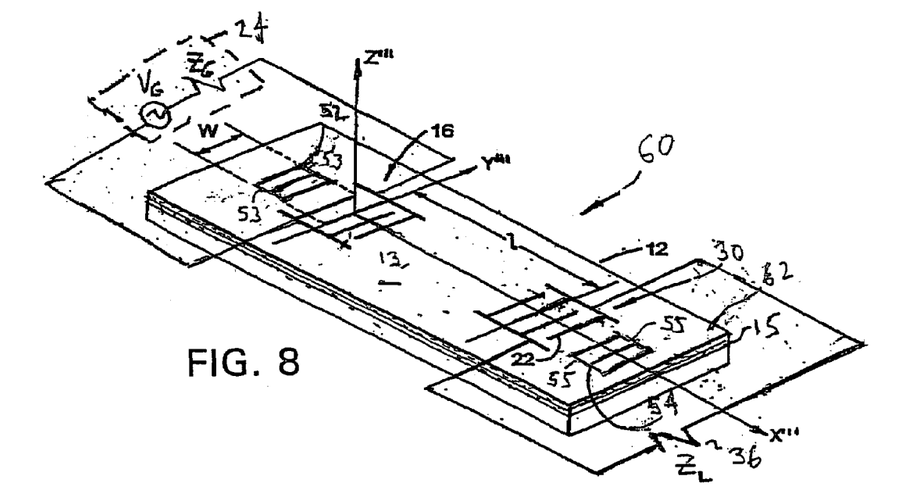
FIG. 8 is a perspective view of an alternate embodiment of the two port Surface Acoustic Wave resonator shown in FIG. 5 that is utilized for the detection of a gas in a high temperature environment.

The inventor also has sputtered a 200 Å thick layer of tungsten trioxide ($WO_3$) over the entire surface of a resonator having platinum IDT's and reflector strips as illustrated in FIG. 8. The resulting device has been successfully used to detect the presence of hydrogen in nitrogen gas by detecting a frequency shift as the tungsten trioxide absorbed hydrogen. The inventor also used a resonator having a 3000 Å thick layer of palladium electron-beam evaporated over a 200 Å thick layer of zirconium to detect hydrogen. The palladium acted as a sponge absorbing up to 900 times its own volume of hydrogen.

In an attempt to increase the sensitivity of the high temperature $WO_3$/Pt LGS sensor to $C_2N_4/N_2$, the inventor exposed the resonator to $O_2$ for thirty minutes, followed by the exposure to $C_2N_4/N_2$ for twenty minutes, in a temperature range from 300° C. to 450° C. Negative frequency variations ($\Delta f$) from 0.8 KHz (at 450° C.) to 1.5 KHz (at 300° C.) were measured between the exposures to $O_2$ and the subsequent exposure to $C_2N_4/N_2$, as shown in the following table:

TABLE

| Measured frequency variations ($\Delta f$) with exposure to $C_2N_4/N_2$ on a $WO_3$/Pt Resonator | | | | |
|---|---|---|---|---|
| Temperature [° C.] | 300 | 350 | 400 | 450 |
| $\Delta f$ [KHz] | 1 | 1.5 | 1.2 | 0.8 |

Figure 12:
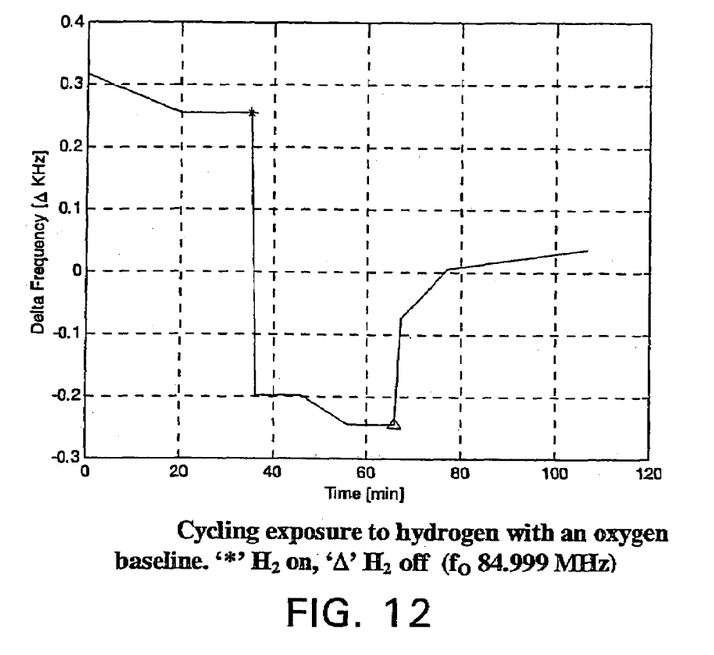
FIG. 12 is a graph of experimental results obtained upon exposure of a Pt transducer delay line with a Pd sensing film deposited in the delay path between the transducers to a mixture of hydrogen and nitrogen gases from an oxygen base line.

The inventor also investigated the sensing of $H_2$ with a Pd film. A two port Pt delay line with a Pd sensing film in the delay path between the IDTs was tested with exposure to $H_2$. The delay line was exposed to $O_2$ for 40 minutes followed by exposure to $H_2$ for 25 minutes, in a temperature range from 250° C. to 400° C. The response of the 200 Å Zr 3000 Å Pd sensing film is illustrated in FIG. 12, where the "*" symbol represents the turning on of the $H_2$ and the turning off of the $O_2$, while the symbol "Δ" represents turning off the $H_2$ and the reintroduction of $O_2$. As can be seen in FIG. 12, there is a 500 Hz frequency shift caused by the exposure to $H_2$ with an $O_2$ baseline at 300° C. The sensing film was also tested at 250° C. with a frequency shift of 200 Hz measured and at 400° C. with a frequency shift of 4 KHz measured.

Figure 13:
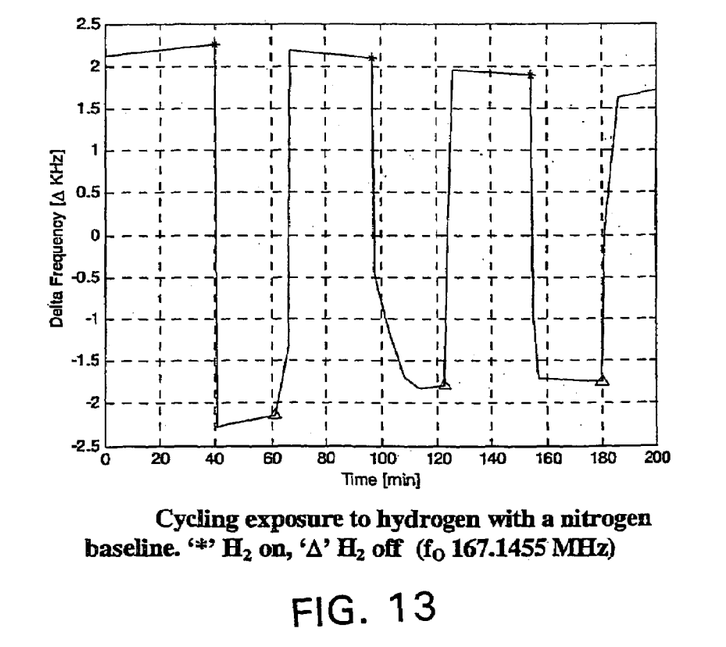
FIG. 13 is a graph of experimental results obtained upon exposure of a two port Pd sensing device without a sensing film to a mixture of hydrogen and nitrogen gases from a nitrogen base line.

The inventor also repeated the above test for a two port Pd resonator without a sensing film at 250° C. with a $N_2$ baseline substituted for the $O_2$ baseline. The results are shown in FIG. 13 where the exposure and recovery are consistent and repeatable with the same magnitude of change of approximately 4 KHz.

While the inventor has successfully tested the present invention at temperatures up to 750° C., it is believed that the invention can be used to detect the presence of specific gases at temperatures well in excess of 750° C. The inventor believes that the upper end of the operational temperature range is only limited by the limits of the materials used to fabricate the gas sensors. In conclusion, the inventor believes that the present invention will be of great commercial interest to the aerospace industry in sensor and frequency control applications, such as fuel leak detection, fire detection, hostile environment detection and frequency control systems.

The principle and mode of operation of this invention have been explained and illustrated in its preferred embodiment. However, it must be understood that this invention may be practiced otherwise than as specifically explained and illustrated without departing from its spirit or scope. For example, while the preferred embodiment has been described as utilizing a regular, or generalized, SAW propagation mode, it will be appreciated that the invention also may be practiced with Shear Horizontal SAW, Pseudo SAW and High Velocity Pseudo SAW modes of wave propagation.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A Surface Acoustic Wave (SAW) device comprising:
   a substrate formed from a material selected from the group of the LGX family of crystals and gallium phosphate, the substrate having a SAW propagation surface;
   a first interdigital transducer formed upon said substrate propagation surface with electrodes formed from an electrically conductive material having a high melting temperature, said first transducer operative upon excitation by an oscillator to launch surface acoustic waves across said propagation surface;
   a second interdigital transducer formed upon said substrate propagation surface spaced apart from said first interdigital transducer, said second transducer having electrodes formed upon said propagation surface from an electrically conductive material having a high melting temperature, said second transducer operative to detect said surface acoustic waves; and
   an adhesive layer formed from a zirconium material that does not migrate into said interdigital transducers, said adhesive layer disposed between said substrate and said first and second interdigital transducers.

2. The device according to claim 1 further including two sets of reflecting electrodes formed upon said adhesive layer, each set of reflecting electrodes being between each of said interdigital transducers and the end of said substrate adjacent to said interdigital transducer, said reflecting electrodes formed from an electrically conductive material having a high melting temperature.

3. The device according to claim 2 wherein said first and second interdigital transducers and said reflecting electrodes are formed from one of the group of platinum and palladium.

4. The device according to claim 3 further including shorting strips formed across the ends of said reflecting electrodes.

5. The device according to claim 4 wherein said propagation surface has Euler angle ranges that include an Euler angle $\phi$ being within a range from $-20°$ to $+20°$; an Euler angle $\theta$, within a range from $0°$ to $+180°$; and an Euler angle $\psi$, within a range from $0°$ to $+90°$.

6. The device according to claim 5 wherein said propagation surface has Euler angles of $(0°, 138.5°, 26.6°)$.

7. The device according to claim 5 wherein each of said interdigital transducers includes a plurality of intertwined fingers with said fingers defining an interdigital structural geometry, said interdigital structural geometry being related to the operating frequency of the device.

8. The device according to claim 7 wherein each of said reflectors includes a plurality of parallel strips extending transversely across said substrate with said reflector strips defining a reflector structural geometry that is related to the operating frequency of the device.

9. The device according to claim 3 wherein the device is included in a high temperature gas sensor whereby the presence of gases having temperatures in excess of several hundred degrees Centigrade are detected.

10. The device according to claim 9 further including a coating of a chemically sensitive material deposited upon said surface of said substrate whereby the presence of a high temperature gas is detected.

11. The device according to claim 3 wherein said first interdigital transducer is connected to an oscillator and further wherein the centers of the first and second first interdigital transducers are separated by a distance equivalent to a plurality of wavelengths of the signal generated by said oscillator.

12. The device according to claim 11 wherein the centers of the first and second first interdigital transducers are separated by a distance within a range of 5 to 3,000 wavelengths.

13. The device according to claim 11 wherein the centers of the first and second first interdigital transducers are separated by a distance within a range of one mm to five cm.

14. A Surface Acoustic Wave (SAW) device comprising:
   a substrate formed from a material selected from one of the group of the LGX family of crystals and gallium phosphate, the substrate having a SAW propagation surface;
   a single interdigital transducer formed upon said substrate propagation surface with electrodes formed from an electrically conductive material having a high melting temperature, said first transducer operative upon excitation by an oscillator to launch surface acoustic waves across said propagation surface;
   at least one set of reflecting electrodes formed upon said substrate propagation surface between said interdigital transducer and an end of said substrate, said reflecting electrodes formed from an electrically conductive material having a high melting temperature, said reflecting electrodes co-operating with said interdigital transducer to form a resonator; and
   an adhesive layer formed from a zirconium material that does not migrate into said interdigital transducer and said at least one set of reflecting electrodes, said adhesive layer disposed between said substrate and said interdigital transducer and between said substrate and said at least one set of reflecting electrodes.

15. The device according to claim 14 wherein said interdigital transducer and said reflecting electrodes are formed from one of the group of platinum and palladium.

16. The device according to claim 15 wherein the device is included in a high temperature sensor.

17. The device according to claim 16 further including a coating of a chemically sensitive material deposited upon said propagation surface of said substrate whereby the presence of a high temperature gas is detected.

* * * * *